US010373823B2

(12) United States Patent
Srinivasan et al.

(10) Patent No.: US 10,373,823 B2
(45) Date of Patent: Aug. 6, 2019

(54) DEPLOYMENT OF LIGHT ENERGY WITHIN SPECIFIC SPECTRAL BANDS IN SPECIFIC SEQUENCES FOR DEPOSITION, TREATMENT AND REMOVAL OF MATERIALS

(71) Applicant: Applied Materials, Inc., Santa Clara, CA (US)

(72) Inventors: Swaminathan T. Srinivasan, Pleasanton, CA (US); Atashi Basu, Menlo Park, CA (US); Pramit Manna, Sunnyvale, CA (US); Khokan C. Paul, Cupertino, CA (US); Diwakar N. Kedlaya, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/994,409

(22) Filed: May 31, 2018

(65) Prior Publication Data

US 2018/0350595 A1 Dec. 6, 2018

Related U.S. Application Data

(60) Provisional application No. 62/515,242, filed on Jun. 5, 2017.

(51) Int. Cl.
*C23C 16/24* (2006.01)
*C23C 16/56* (2006.01)
(Continued)

(52) U.S. Cl.
CPC ........ *H01L 21/02348* (2013.01); *C23C 16/24* (2013.01); *C23C 16/56* (2013.01);
(Continued)

(58) Field of Classification Search
CPC ........... H01L 21/02126; H01L 21/0214; H01L 21/02164; H01L 21/02167; H01L 21/0217; H01L 21/02348
See application file for complete search history.

(56) References Cited

U.S. PATENT DOCUMENTS 8,512,818 B1 8/2013 Varadarajan et al.
8,911,553 B2 12/2014 Baluja et al.
(Continued)

OTHER PUBLICATIONS

Lutz Prager et al. "Conversion of Perhydropolysilazane into a SiOx Network Triggered by Vacuum Ultraviolet Irradiation: Access to Flexible, Transparent Barrier Coatings," Chemistry: A European Journal, 2007, 13, 8522-8529.
(Continued)

*Primary Examiner* — Robert G Bachner
*Assistant Examiner* — Molly K Reida
(74) *Attorney, Agent, or Firm* — Patterson + Sheridan LLP

(57) ABSTRACT

In an embodiment, a method includes depositing a silicon matrix on a substrate; exposing the silicon matrix to a first wavelength or wavelength range of ultraviolet radiation in an ultraviolet processing chamber; exposing the silicon matrix to a second wavelength or wavelength range of ultraviolet radiation in an ultraviolet processing chamber, wherein the second wavelength or wavelength range includes a wavelength lower than any wavelength in the first wavelength or wavelength range; exposing the silicon matrix to a third wavelength or wavelength range of ultraviolet radiation in an ultraviolet processing chamber, wherein the third wavelength or wavelength range includes a wavelength lower than any wavelength in the first wavelength or wavelength range and second wavelength or wavelength range; and a repeat exposure of any wavelength range. In some embodiments, a healing operation compris-
(Continued)

ing a deposition operation, a reactive cure, a thermal cure, or a combination thereof may be performed.

20 Claims, 7 Drawing Sheets

(51) Int. Cl.

| | |
|---|---|
| ***H01L 21/3105*** | (2006.01) |
| ***C23C 16/30*** | (2006.01) |
| ***H01L 21/67*** | (2006.01) |
| ***H01L 21/677*** | (2006.01) |
| ***H01L 21/02*** | (2006.01) |
| ***H01L 21/321*** | (2006.01) |

(52) U.S. Cl.

CPC ...... *H01L 21/0217* (2013.01); *H01L 21/0234* (2013.01); *H01L 21/02123* (2013.01); *H01L 21/02164* (2013.01); *H01L 21/02208* (2013.01); *H01L 21/02211* (2013.01); *H01L 21/02271* (2013.01); *H01L 21/321* (2013.01); *H01L 21/6719* (2013.01); *H01L 21/67115* (2013.01); *H01L 21/67742* (2013.01); *H01L 21/67167* (2013.01); *H01L 21/67207* (2013.01)

(56) References Cited

U.S. PATENT DOCUMENTS

| | | | | |
|---|---|---|---|---|
| 9,050,623 | B1 | 6/2015 | Varadarajan | |
| 2012/0083117 | A1* | 4/2012 | Ahn | H01L 21/02126 438/653 |
| 2017/0316936 | A1* | 11/2017 | Wang | H01L 21/02126 |

OTHER PUBLICATIONS

Masataka Hirose et al., "Beam Induced Modification of Polysilane for Fine Pattern Generation," Journal of Photopolymer Science and Technology, 1994, vol. 7, No. 3, 599-606.

* cited by examiner

DEPLOYMENT OF LIGHT ENERGY WITHIN SPECIFIC SPECTRAL BANDS IN SPECIFIC SEQUENCES FOR DEPOSITION, TREATMENT AND REMOVAL OF MATERIALS

CROSS-REFERENCE TO RELATED APPLICATIONS

This application claims benefit of U.S. Provisional Patent Application No. 62/515,242, filed Jun. 5, 2017, the entirety of which is herein incorporated by reference

BACKGROUND

Field

Embodiments of the present disclosure generally relate to methods of processing a substrate and semiconductor processing equipment.

Description of the Related Art

Ultraviolet (UV) based curing of thin films has been effective in enabling deployment of many new materials for semiconductor manufacturing and other applications. Combining energy produced by UV lamps, LEDs, lasers and plasma-based UV sources, with optical filters and other optical elements, one can subject a material to optical energy in a manner that specific bonds are affected by excitation. The nature of the excitation could lead to thermal effects but is not limited to thermal effects. For example, reaction surfaces may be accessed in the process of excitation, enabling unique new chemical effects.

In conventional processes, a hydrogen-rich amorphous silicon matrix is deposited by flowable chemical vapor deposition (FCVD) to fill trenches and voids in a patterned substrate. In order to cure the silicon matrix, UV curing operations can be performed. However, UV curing with broadband lamps causes significant outgassing of the trapped hydrogen. As the concentration of hydrogen in the silicon matrix decreases through outgassing, voids are formed within the silicon matrix. Such effects are due to the broadband UV source breaking Si—Si, Si—H, and Si—N bonds during a UV cure causing the matrix to collapse. Shorter wavelengths (higher energy) cleave the Si—H bonds, evolving hydrogen, yet also cleave Si—Si bonds and Si—N bonds.

Thus, there is a need for deployment of light energy in specific spectral bands in specific sequences for deposition, treatment, and removal of materials in order to mitigate matrix collapse and for selective cleavage of chemical bonds within the matrix.

SUMMARY

Methods of processing a substrate are provided herein. In one example, a method includes depositing a silicon matrix on a substrate; exposing the silicon matrix to a first wavelength or wavelength range of ultraviolet radiation in an ultraviolet processing chamber; exposing the silicon matrix to a second wavelength or wavelength range of ultraviolet radiation in an ultraviolet processing chamber, wherein the second wavelength or wavelength range includes a wavelength lower than any wavelength in the first wavelength or wavelength range; exposing the silicon matrix to a third wavelength or wavelength range of ultraviolet radiation in an ultraviolet processing chamber, wherein the third wavelength or wavelength range includes a wavelength lower than any wavelength in the first wavelength or wavelength range and second wavelength or wavelength range; and repeating exposing the silicon matrix in an ultraviolet processing chamber to the first wavelength or wavelength range, the second wavelength or wavelength range, the third wavelength or wavelength range, or a combination thereof.

In some embodiments, a method of processing a substrate is provided. The method includes depositing a silicon matrix on a substrate; exposing the silicon matrix to a first wavelength or wavelength range of ultraviolet radiation in an ultraviolet processing chamber; exposing the silicon matrix to a second wavelength or wavelength range of ultraviolet radiation in an ultraviolet processing chamber, wherein the second wavelength or wavelength range includes a wavelength lower than any wavelength in the first wavelength or wavelength range; exposing the silicon matrix to a third wavelength range of ultraviolet radiation in an ultraviolet processing chamber, wherein the third wavelength range includes a wavelength lower than any wavelength in the first wavelength or wavelength range and second wavelength or wavelength range; treating the silicon matrix by a deposition operation, a reactive cure, a thermal cure, or a combination thereof; and repeating exposing the silicon matrix in an ultraviolet processing chamber to the first wavelength or wavelength range, the second wavelength or wavelength range, the third wavelength or wavelength range, or a combination thereof.

In some embodiments, a method of processing a substrate is provided. The method includes depositing a silicon matrix on a substrate; exposing the silicon matrix to a first ultraviolet radiation having a wavelength or wavelength range between about 190 nm and about 800 nm in an ultraviolet processing chamber; exposing the silicon matrix to a second ultraviolet radiation having a wavelength or wavelength range between about 180 nm and about 190 nm in an ultraviolet processing chamber; exposing the silicon matrix to a third ultraviolet radiation having a wavelength or wavelength range between about 165 nm and about 180 nm in an ultraviolet processing chamber; treating the silicon matrix by a deposition operation, a reactive cure, a thermal cure, or a combination thereof; repeating exposing the silicon matrix to the first, second, and third ultraviolet radiation in an ultraviolet processing chamber; and maintaining the temperature of the substrate between about −100° C. and about 500° C. during exposure to ultraviolet radiation.

Other and further embodiments are described below.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
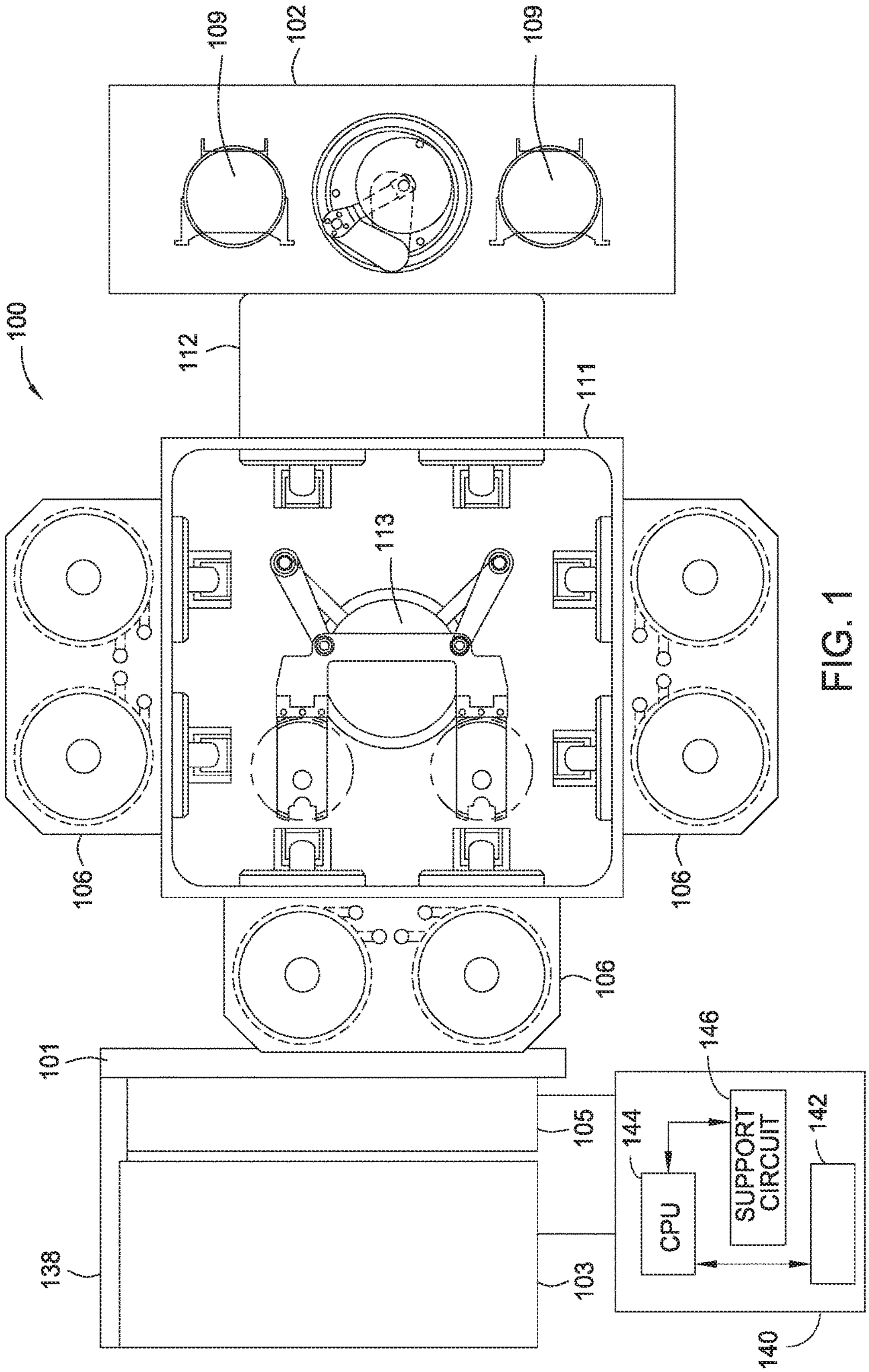
FIG. 1 is a plan view of a semiconductor processing system in which embodiments of the disclosure may be incorporated.

Embodiments of the present disclosure generally relate to methods of processing a substrate and semiconductor processing equipment. Specifically, ultraviolet (UV)-based curing of a deposited silicon matrix is used to create a continuous fill of trenches and voids in a patterned substrate.

After depositing an amorphous silicon matrix (that can be hydrogen rich), a UV-based curing operation using broadband UV sources causes significant outgassing of the trapped hydrogen among other effects, and leads to voids being formed within the features of substrate, among other effects. These detrimental effects are due partly to the energy that comes from the broadband lamps used in conventional operations, and the relative bond energies of the Si—Si bonds and Si—H bonds, the Si—H bonds being higher in energy. Stated otherwise, the energy from a broadband UV source cleaves Si—Si bonds and Si—H bonds indiscriminately. Because the Si—Si bonds have lower bond energies than Si—H, wavelengths that cleave Si—H can lead to dramatic changes in the amorphous silicon matrix by also cleaving Si—Si bonds. Similar issues arise with Si—N bonds. Aspects of the present disclosure address such issues.

In order to mitigate cleavage of the Si—Si bonds and Si—N bonds, some embodiments utilize the difference in UV absorption spectra of the various chemical bonds and healing operations. Successive UV curing of the substrate at discrete wavelengths or wavelength ranges (with a greater energy associated with a shorter wavelength), rather than a broadband UV cure, allows the Si—H bonds to cleave while limiting the effects on the Si—Si bonds (and the Si—N bonds). Healing operations at the conclusion or during the sequenced UV treatment mitigates damage to the silicon matrix.

In one example, successive exposure of the silicon matrix to three discrete wavelength ranges or wavelengths of UV light allows breaking of different bonds during discrete operations. For example, exposure at a first wavelength range or wavelength causes Si—Si bond relaxation, followed by exposure at a second wavelength range or wavelength causes Si—H bond relaxation, and a subsequent exposure to a third wavelength range or wavelength causes relaxation of both Si—Si and Si—H bonds. Advantageously, this protocol allows for a more continuous fill of the volumes of the features, rather than voids, because the silicon matrix can rearrange and re-form during and/or after the Si—Si bond and Si—H bond breaking in different operations.

In some embodiments, a sequenced UV treatment operation and a healing operation may be performed. The healing operation may include a deposition operation, a reactive cure, a thermal cure, or a combination thereof. The reactive cure may include exposing the silicon matrix to a reactive species containing silicon such that the silicon can move into the amorphous silicon matrix and form extended Si—Si bonds as the hydrogen is evolving and thereby mitigating shrinkage. Alternately, for SiNx material systems, the reactive cure may include exposing the silicon matrix to a reactive species containing nitrogen (for example, $NH_3$ or $N_2$) after plasma and/or thermal activation. The sequenced UV treatment operation and reactive cure may be performed, independently, one or more times. The reactive cure may be performed at the conclusion of a sequence of UV treatments or during a sequence of UV treatments. "Silicon matrix" may include silicon or silicon containing compounds such as SiOx, SiNx, SiCx, SiOC, SiCN, SiON, and mixtures thereof. The processes described herein also apply to aluminum based dielectrics such as AlOx, AlNx, and mixtures thereof. The processes described herein also apply to carbon and carbides such as boron carbide.

In some embodiments, a sequenced UV treatment operation and a deposition of amorphous silicon is performed. Since diffusion of silicon may be limited to the region near the surface, an operation comprising a limited amount of amorphous silicon (aSi) deposition may be performed. The aSi deposition operation and sequenced UV treatment operation may be performed, independently, one or more times. aSi deposition may be performed at the conclusion of a sequence of UV treatments or during a sequence of UV treatments.

In some embodiments, a thermal cure or anneal operation may be performed in addition to a sequenced UV treatment operation. The thermal cure or anneal operation may be performed at the conclusion of a sequence of UV treatments, or during a sequence of UV treatments. A thermal cure or anneal operation can help settle the aSi matrix or SiNx matrix such that it does not degrade significantly at higher temperatures encountered in process integration. The thermal cure or anneal operation and sequenced UV treatment may be performed, independently, one or more times.

The Processing Tool

Embodiments of the present disclosure can be implemented in various types of apparatus.

FIGS. 1-4 show an embodiment of an apparatus appropriate for use with certain embodiments of the disclosure that uses UV sources. Optical components may be used in the radiation source to control the part of the spectrum in order to irradiate the substrate at different wavelength ranges or different wavelengths during use of a broad band UV source. The optical components may include filters, reflectors, or a combination thereof.

In a processing chamber used for UV curing/treatment, a tandem processing chamber provides two separate and adjacent processing regions in a chamber body and a lid having one or more bulb isolating windows aligned respectively above each processing region. The bulb isolating windows may be implemented with one window per side of the tandem processing chamber to isolate one or more bulbs from the substrate in one large common volume, or with each bulb of an array of bulbs enclosed in a UV transparent envelope which is in direct contact with a processing region. One or more UV bulbs per processing region may be covered by housings coupled to the lid and emit UV light that is directed through the windows onto each substrate located within each processing region.

The UV bulbs can be an array of bulbs, lamps, and lasers utilizing any of the state of the art UV illumination sources including, but not limited to, microwave arcs, radio frequency filament (capacitively coupled plasma) and inductively coupled plasma (ICP) lamps. Additionally, the UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV bulbs and lasers are a source of ultraviolet radiation, and may transmit a broad spectral range of wavelengths of UV and infrared (IR) radiation.

FIG. 1 shows a plan view of a semiconductor processing system 100. The semiconductor processing system 100 illustrates one embodiment of a Producer™ processing system, commercially available from Applied Materials, Inc., of Santa Clara, Calif. The semiconductor processing system 100 is a self-contained system having the necessary processing utilities supported on a mainframe structure 101. The semiconductor processing system 100 generally includes a front end staging area 102 where substrate cassettes 109 are supported and substrates are loaded into and unloaded from a loadlock chamber 112, a transfer chamber 111 housing a substrate handler 113, a series of tandem processing chambers 106 mounted on the transfer chamber 111 and a back end 138 which houses the support utilities needed for operation of the semiconductor processing system 100, such as a gas panel 103, and a power distribution panel 105.

Figure 3:
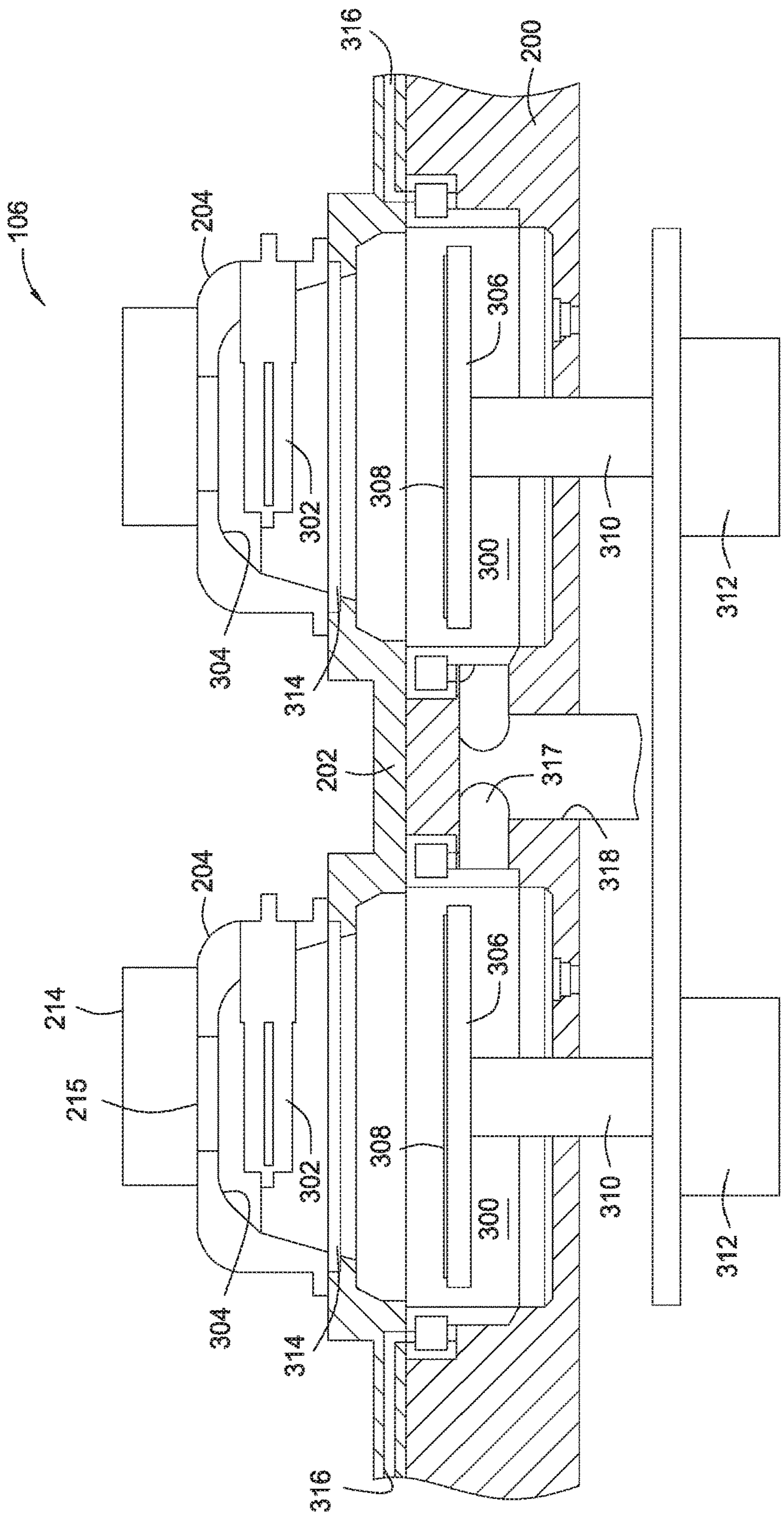
FIG. 3 is a partial section view of the tandem processing chamber that has a lid assembly with two UV bulbs and/or lasers disposed respectively above two processing regions.
Figure 4:
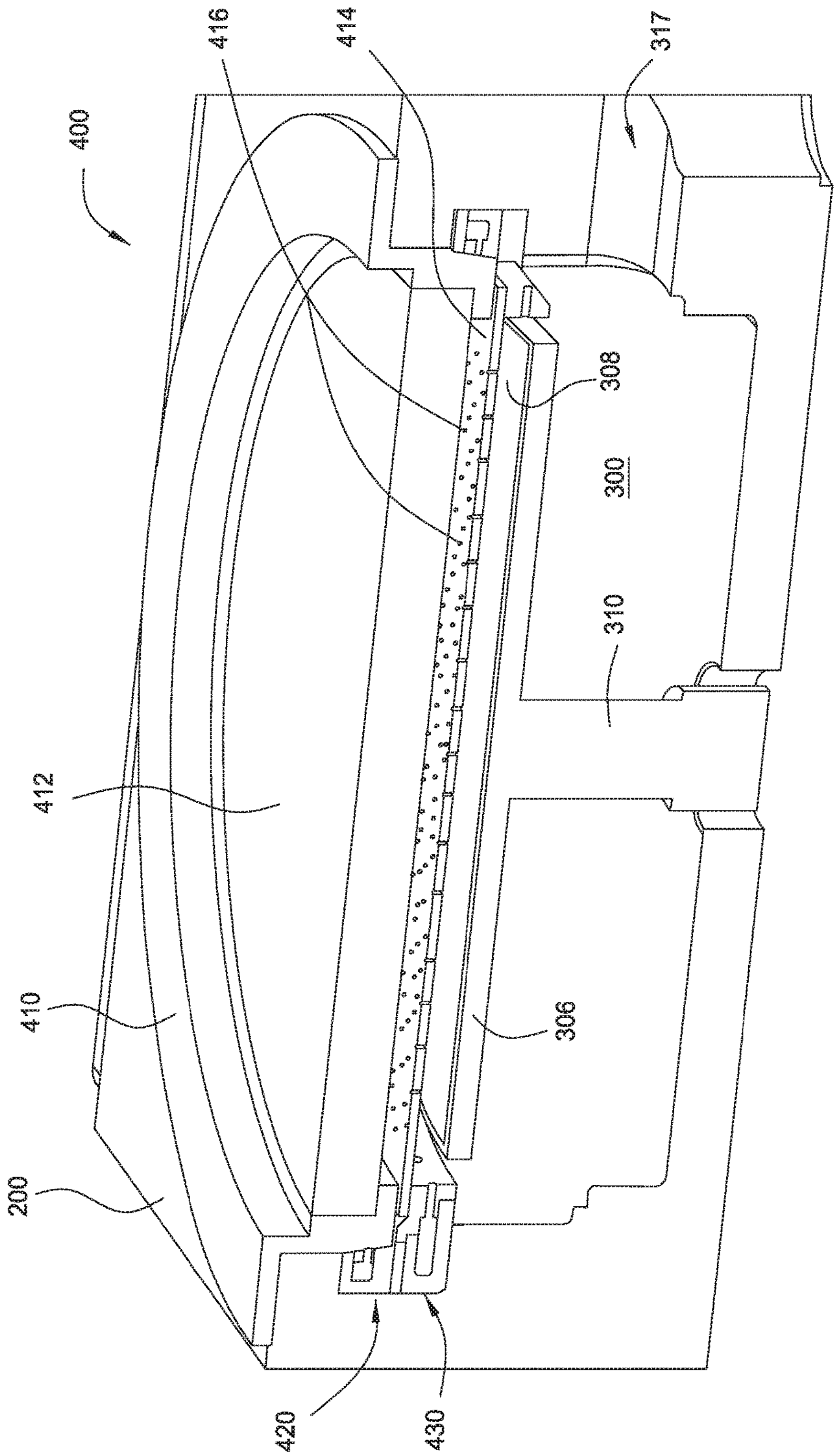
FIG. 4 is a schematic isometric cross-sectional view of a portion of one of the processing chambers without the lid assembly.

Each of the tandem processing chambers 106 includes two processing regions for processing the substrates (see, FIG. 3). The two processing regions share a common supply of gases, common pressure control, and common process gas exhaust/pumping system. Modular design of the system enables rapid conversion from any one configuration to any other. The arrangement and combination of chambers may be altered for purposes of performing specific process operations. Any of the tandem processing chambers 106 can include a lid that includes one or more UV lamps for use in a cure process of a low K material on the substrate and/or in a chamber clean process. In one embodiment, all three of the tandem processing chambers 106 have UV lamps and/or lasers and are configured as UV curing chambers to run in parallel for maximum throughput.

In an alternative embodiment where not all of the tandem processing chambers 106 are configured as UV curing chambers, the semiconductor processing system 100 can be adapted with one or more of the tandem processing chambers 106 having supporting chamber hardware known to accommodate various other known processes such as chemical vapor deposition (CVD), flowable chemical vapor deposition (FCVD) physical vapor deposition (PVD), etch, and the like. For example, the semiconductor processing system 100 can be configured with one of the tandem processing chambers 106 as a FCVD chamber for depositing materials, such as a low dielectric constant (K) film, on the substrates. Such a configuration can maximize research and development fabrication utilization and, if desired, eliminate exposure of as-deposited films to atmosphere.

A controller 140, including a central processing unit (CPU) 144, a memory 142, and support circuits 146, is coupled to the various components of the semiconductor processing system 100 to facilitate control of the processes described herein. The memory 142 can be any computer-readable medium, such as random access memory (RAM), read only memory (ROM), floppy disk, hard disk, or any other form of digital storage, local or remote to the semiconductor processing system 100 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the UV curing in the tandem processing chambers 106 to perform processes described herein.

Figure 2:
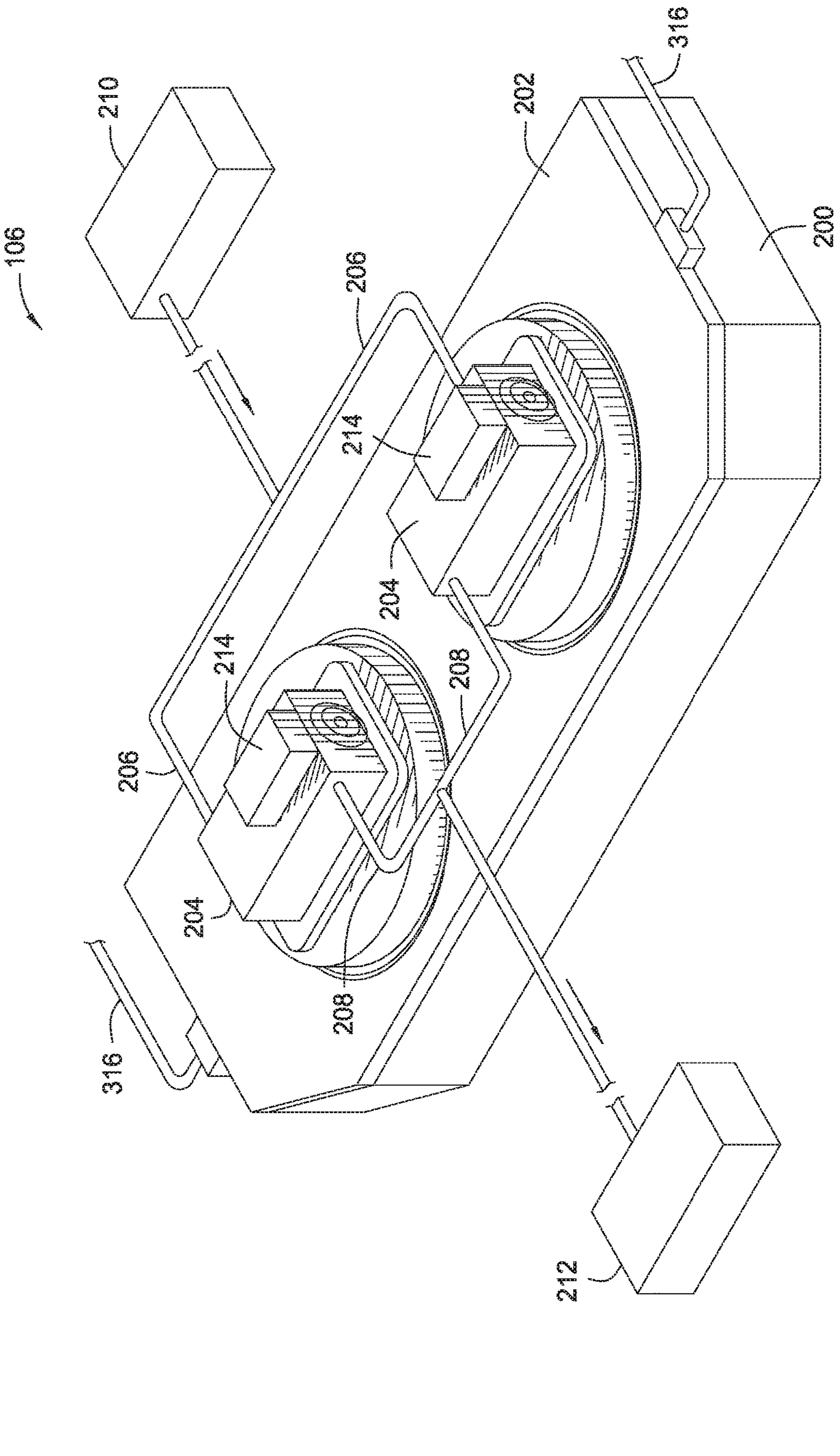
FIG. 2 is a view of a tandem processing chamber of the semiconductor processing system that is configured for UV curing.

FIG. 2 illustrates one of the tandem processing chambers 106 of the semiconductor processing system 100 that is configured for UV curing. The tandem processing chambers 106 include a chamber body 200 and a lid 202 that can be hinged to the chamber body 200. The chamber body 200 may be made from aluminum. Coupled to the lid 202 are two housings 204 that are each coupled to inlets 206 along with outlets 208 for passing cooling air through an interior of the two housings 204. The cooling air can be at room temperature or approximately twenty-two degrees Celsius. A central pressurized air source 210 provides a sufficient flow rate of air to the inlets 206 to insure proper operation of any UV lamp bulbs, lasers, and/or power sources 214 for the bulbs and/or lasers associated with the tandem processing chambers 106. The outlets 208 receive exhaust air from the two housings 204, which is collected by a common exhaust system 212 that can include a scrubber to remove ozone potentially generated by the UV bulbs and/or lasers, depending on bulb or laser selection. Ozone management issues can be avoided by cooling the lamps with oxygen-free cooling gas (e.g., nitrogen, argon, or helium).

FIG. 3 shows a partial section view of the tandem processing chambers 106 with the lid 202, the two housings 204 and the power sources 214. Each of the two housings 204 cover a respective one of two UV radiation sources (lamp bulbs and/or lasers) 302 disposed respectively above two processing regions 300 defined within the chamber body 200. Each of the processing regions 300 includes a heating substrate support, such as substrate support 306, for supporting a substrate 308 within the processing regions 300. The substrate supports 306 can be made from ceramic or metal such as aluminum. Preferably, the substrate supports 306 couple to stems 310 that extend through a bottom of the chamber body 200 and are operated by drive systems 312 to move the substrate supports 306 in the processing regions 300 toward and away from the UV radiation source 302. The drive systems 312 can also rotate and/or translate the substrate supports 306 during curing to further enhance uniformity of substrate illumination. Adjustable positioning of the substrate supports 306 enables control of volatile cure by-product and purge and clean gas flow patterns and residence times in addition to potential fine tuning of incident UV irradiance levels on the substrate 308 depending on the nature of the light delivery system design considerations such as focal length.

In general, any UV source such as mercury microwave arc lamps, pulsed xenon flash lamps, UV lasers, or high-efficiency UV light emitting diode arrays may be used. The UV radiation source 302 are sealed plasma bulbs filled with one or more gases such as xenon (Xe) or mercury (Hg) for excitation by the power sources 214. Preferably, the power sources 214 are microwave generators that can include one or more magnetrons (not shown) and one or more transformers (not shown) to energize filaments of the magnetrons. In one embodiment having kilowatt microwave (MW) power sources, each of the two housings 204 includes an aperture 215 adjacent the power sources 214 to receive up to about 6000 W of microwave power from the power sources 214 to subsequently generate up to about 100 W of UV light from each of the UV radiation source (e.g., bulbs) 302. In another embodiment, the UV radiation source 302 can include an electrode or filament therein such that the power sources 214 represent circuitry and/or current supplies, such as direct current (DC) or pulsed DC, to the electrode.

For some embodiments, the power sources 214 can include radio frequency (RF) energy sources that are capable of excitation of the gases within the UV radiation source 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power sources 214 being RF energy sources include an increase in efficiency.

In some embodiments, the UV radiation source 302 emits light across a broad band of wavelengths from 150 nm to 800 nm. A broad band UV source may be Xenon (Xe) or mercury (Hg) lamp having wavelength between about 150 m and about 800 nm. In one embodiment, the UV radiation source 302 emits light at various wavelengths, for example, a first wavelength or wavelength range is between about 190 nm and about 800 nm, a second wavelength or wavelength range is between about 180 nm and about 190 nm, and a third wavelength or wavelength range is between about 165 nm and about 180 nm (such as between about 170 nm and about 180 nm). In some embodiments, a single wavelength can be used. The single wavelength source may be a laser. For example, $Xe_2$* (wavelength 172 nm), KrCl* (wavelength 222 nm), KrF (wavelength 248 nm), XeBr (wavelength 282 nm), or XeCl (wavelength 308 nm) can generate UV radiation. In some embodiments, multiple lasers and/or bulbs may be used. In one example, wavelengths greater than 190 nm may facilitate excitation, and thus, relaxation and/or cleavage of Si—Si bonds, while wavelengths between about 180 nm and about 190 nm facilitate excitation of Si—H bonds as well Si—Si bonds, resulting in relaxation of Si—H bonds as well as relaxation and/or cleavage of Si—Si bonds. Wavelengths less than 180 nm result in cleavage of both Si—Si and Si—H bonds. Thus, relaxation or rearrangement of Si—Si bonds may be caused to occur to prior to relaxation or cleavage of Si—H bonds, resulting in an improved silicon matrix. Exposure to different wavelengths may occur in cyclical iterations, resulting in further improvements to the silicon matrix, by reducing the likelihood of collapse of the silicon matrix, which occurs during excessive cleaving of Si—H bonds.

The gases selected for use within the UV radiation source 302 can determine the wavelengths emitted. UV light emitted from the UV radiation source 302 enters the processing regions 300 by passing through windows 314 disposed in apertures in the lid 202. The windows 314 preferably are made of an OH free synthetic quartz glass and have sufficient thickness to maintain vacuum without cracking. Further, the windows 314 are preferably fused silica that transmits UV light down to approximately 150 nm. Since the lid 202 seals to the chamber body 200 and the windows 314 are sealed to the lid 202, the processing regions 300 provide volumes capable of maintaining pressures from approximately 1 Torr to approximately 650 Torr. Processing or cleaning gases enter the processing regions 300 via a respective one of two inlet passages 316. The processing or cleaning gases then exit the processing regions 300 via a common outlet port 318. Additionally, the cooling air supplied to the interior of the two housings 204 circulates past the UV radiation source 302, but is isolated from the processing regions 300 by the windows 314.

The two housings 204 may include an interior parabolic surface defined by a cast quartz lining 304 coated with a dichroic film. The quartz linings 304 reflect UV light emitted from the UV radiation source 302 and are shaped to suit the cure processes as well as the chamber clean processes based on the pattern of UV light directed by the quartz linings 304 into the processing regions 300. The quartz linings 304 may adjust to better suit each process or task by moving and changing the shape of the interior parabolic surface. Additionally, the quartz linings 304 may transmit infrared light and reflect ultraviolet light emitted by the UV radiation source 302 due to the dichroic film. The dichroic film usually constitutes a periodic multilayer film composed of diverse dielectric materials having alternating high and low refractive index. Since the coating is non-metallic, microwave radiation from the power sources 214 that is downwardly incident on the backside of the quartz linings 304 does not significantly interact with, or get absorbed by, the modulated layers and is readily transmitted for ionizing the gas in the UV radiation source 302.

Substrates are brought into the processing region 300, to perform a post-treatment cure of dielectric films deposited on the substrate 308. The films may be low-k dielectric films. After UV exposure, Si—Si, Si—H, and/or Si—N bonds break and/or relax, and the hydrogen and nitrogen outgasses from the film, leaving a silicon backbone, and increasing porosity which decreases the k value and reduces the current carrying capacity of the film.

In conventional systems, a cross-flow non-uniform gas flow profile purges the chamber during curing and outgassing of the substrate. A purge gas flows from one side of the chamber to the opposite side, in-between the substrate and the window, so that any residue escaping the film is carried away before the residue can condense on the window or anywhere else in the chamber.

Hardware enables a specific gas flow profile distribution across the substrate 308 being processed in a UV chamber, lamp heated chamber, or other chamber where "light" energy is used to process a film or catalyze a reaction, either directly on or above the substrate 308. FIGS. 4A-4B shows a schematic isometric cross-sectional view of a portion of one of the processing chambers 400 including improved gas flow profile uniformity and increased substrate throughput during processing.

A portion of processing chamber 400 shows various hardware designs to enable control of the gas flow profile throughout the processing chamber.

A window assembly is positioned within the processing chamber 400 to hold a vacuum window 412. The window assembly includes a vacuum window clamp 410 that rests on a portion of the chamber body 200 and supports the vacuum window 412 through which UV light may pass from the UV radiation source 302, which is part of the lid assembly above the chamber body 200. The vacuum window 412 is positioned between the UV radiation source 302, and the substrate support 306. The UV radiation source 302 is spaced apart from the substrate support 306 and configured to generate and transmit ultraviolet radiation to a substrate 308 positioned on the substrate support 306.

A transparent showerhead 414 is positioned within the processing region 300 and between the vacuum window 412 and the substrate support, such as substrate support 306. The transparent showerhead defines an upper processing region 320 between the vacuum window 412 and transparent showerhead 414 and further defines a lower processing region 322 between the transparent showerhead 414 and the substrate support, such as substrate support 306. The transparent showerhead 414 also has one or more passages 416 between the upper and lower processing regions 320, 322. The passages 416 may have a roughened surface 418, sometimes referred to as "frosted", so that the passages 416 are not perfectly transparent, which otherwise could potentially cause shadows on the substrate 308 and impair proper UV curing of the film. The passages 416, which may be frosted, diffuse the UV light so there is no light pattern on the substrate 308 during processing.

Figures 5A, 5B:
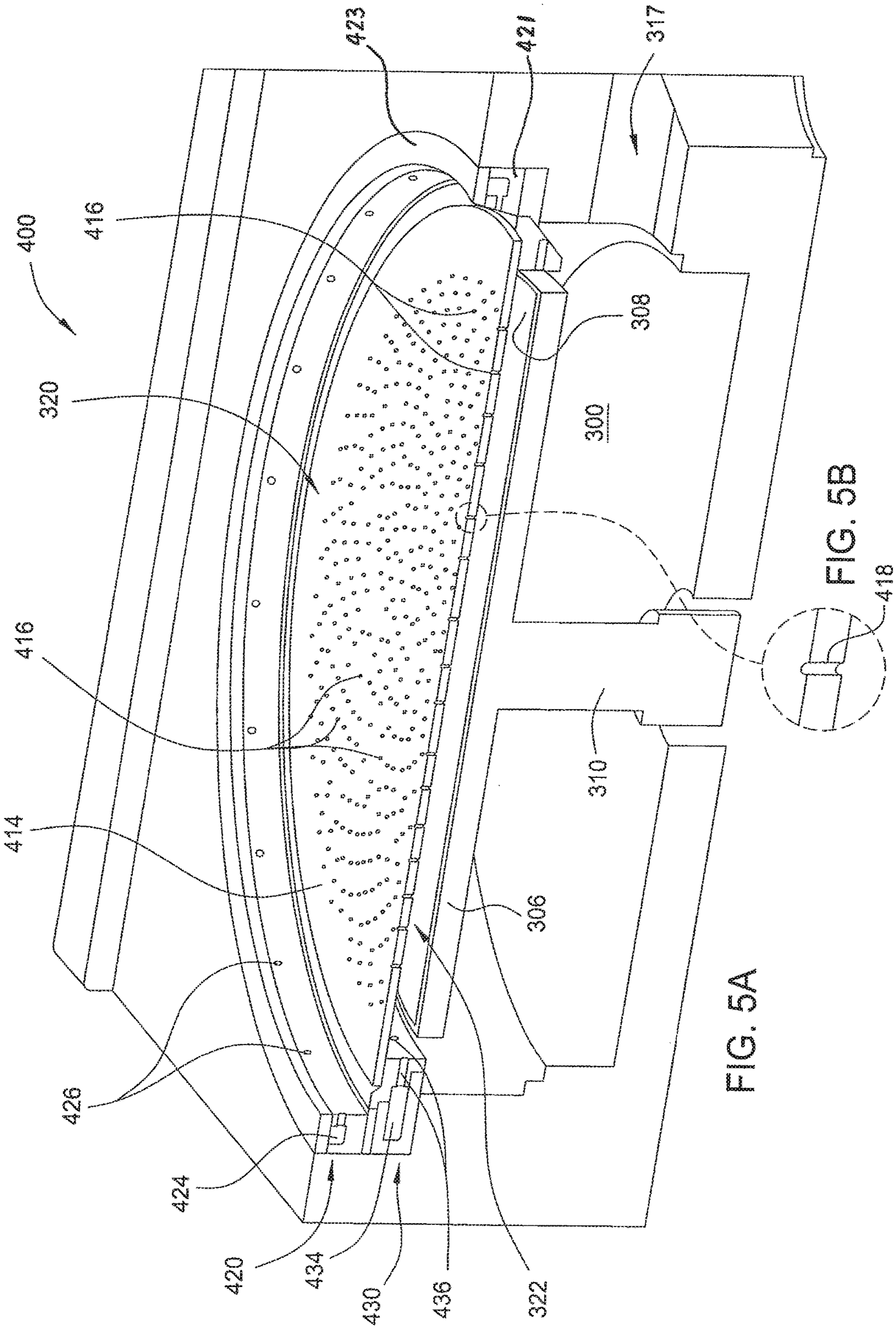
FIG. 5A is a schematic isometric cross-sectional view of the processing chamber in FIG. 4 without the window assembly.
FIG. 5B is a close up of the cross-section of the showerhead shown in FIG. 5A.

The transparent showerhead 414 forms a second window through which UV light may pass to reach the substrate 308. As a second window, the showerhead 414 needs to be transparent to the wavelengths or wavelength ranges of light desired for UV curing the film on the substrate 308. The transparent showerhead may be formed of various transparent materials such as quartz or sapphire. The passages 416 may be formed by drilling holes through a quartz piece to form and shape the transparent showerhead 414 to fit within the processing region 300. The surface of the quartz piece may be flame polished whereas the drilled holes may be etched to form the roughened surface 418 (FIG. 5B). The size and density of the passages 416 may be uniform or non-uniform to effectuate the desired flow characteristics across the substrate surface. The passages 416 may have either a uniform flow profile where the flow per radial area across the substrate 308 is uniform or the gas flow can be preferential to the center or edge of the substrate 308, i.e. the gas flow may have a preferential flow profile.

The transparent showerhead 414 and vacuum window 412 may be coated to have a band pass filter and to improve transmission of the desired wavelengths or wavelength ranges. For example, an anti-reflective coating (ARC) may be deposited on the transparent showerhead 414 and vacuum window 412 to improve the transmission efficiency of desired wavelengths or wavelength ranges. A reflective coating to reflect IR and allow UV to pass or a dichroic coating to reflect UV and allow IR to pass may also be applied to the transparent showerhead 414 and vacuum window 412 surfaces. The coatings may be formed by PVD, CVD, FCVD, or other suitable deposition techniques. The coatings may include an inorganic film layer having a desired film transmittance and refractive index that can assist in the transmission of light through the transparent showerhead 414 and vacuum window 412 to the substrate 308. In one embodiment, the coatings may contain a titanium oxide ($TiO_2$) layer, a tin oxide layer ($SnO_2$), silicon oxide ($SiO_2$) or combinations thereof, which are formed on the surfaces of the vacuum window 412 and transparent showerhead 414.

In another embodiment, the ARC coating may be a composite layer having one or more layers formed on the surfaces of the vacuum window 412 and transparent showerhead 414. In one embodiment, the ARC coating may be a film stack including a first layer formed on a second layer, which is formed on the surfaces of the of the vacuum window 412 and transparent showerhead 414. In one embodiment, the first layer may be a silicon oxide layer ($SiO_2$) and the second layer may be a titanium oxide ($TiO_2$) layer or a tin oxide layer ($SnO_2$) or vice versa. In another embodiment, the ARC layer may include a film stack containing repeated silicon oxide ($SiO_2$) and titanium oxide ($TiO_2$) layers.

A gas distribution ring 420 having one or more gas distribution ring passages is disposed within the processing region 300. The gas distribution ring 420 may include a base distribution ring 421 and a gas inlet ring 423. The base distribution ring 421 may have one or more gas distribution ring passages 426. The one or more gas distribution ring passages 426 couple a gas distribution ring inner channel 424 with the upper processing region 320, forming a gas flow path between the inner channel 424 and the upper processing region 320 above the transparent showerhead 414. A gas outlet ring 430 is positioned below the gas distribution ring 420 and may be at least partially below the transparent showerhead 414 within the processing region 300. The gas outlet ring 430 also has one or more gas outlet passages 436 coupling a gas outlet ring inner channel 434 and the lower processing region 322, forming a gas flow path between the lower processing region 322 and the gas outlet inner channel 434. The one or more gas outlet passages 436 of the gas outlet ring 430 are disposed at least partially below the transparent showerhead 414.

When the UV radiation source 302 is turned on, both the vacuum window 412 and the transparent showerhead 414 are heated due to the infrared light coming from the lamp. The transparent showerhead 414 may be transparent to UV light but absorbs some of the IR light, thus creating a heated channel between the two windows for the ozone to break down in the upper processing region 320, and then travel down into the lower processing region 322 for cleaning. The IR light absorbed by the transparent showerhead 414 creates a temperature gradient which interacts with ozone injected into the upper processing region 320 from the gas distribution ring 420, causing the ozone to break down. The amount of ozone breaking down may be proportional to the temperature and surface area of the components surrounding the upper processing region 320, such as the transparent showerhead 414 and the gas distribution ring 420. By increasing the surface area of the heated components, less energy may be necessary to break down the ozone into reactive oxygen radicals, and improve cleaning efficiencies. Additionally, ozone may be delivered to the substrate 308 uniformly where the UV light will break the ozone into $O_2$ and radical oxygen, which can be used to etch an organic film or material on the substrate 308.

Methods

Figure 6:
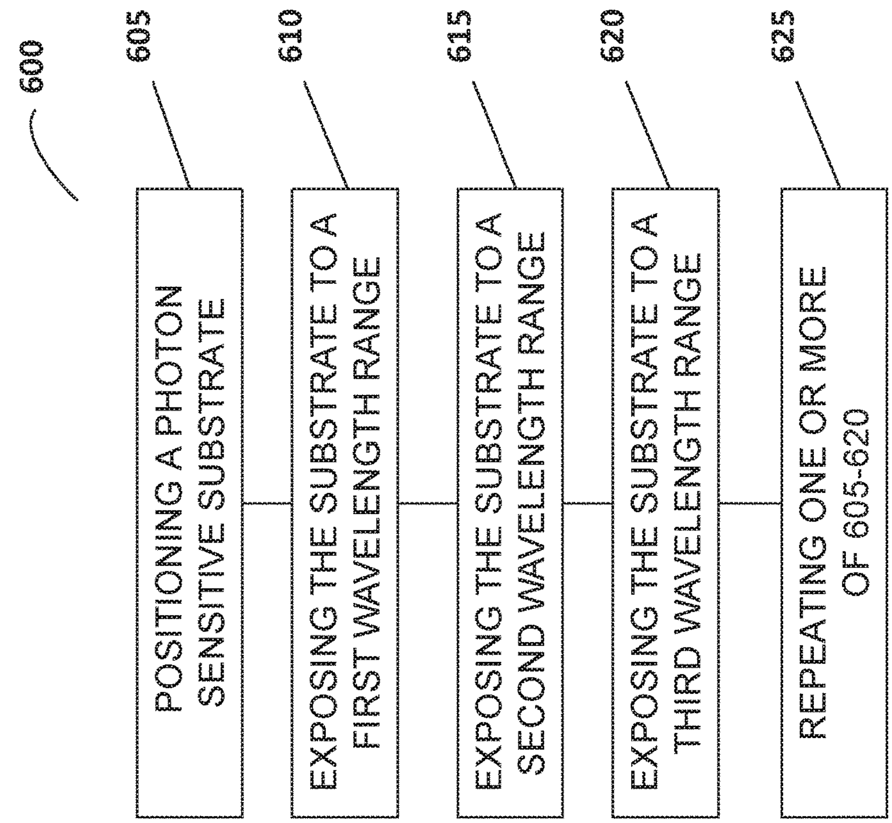
FIG. 6 is a process flow diagram for a method according to some embodiments.

FIG. 6 shows a process flow diagram for a method of a sequenced UV treatment operation on a photon sensitive substrate according to some embodiments. The method 600 includes positioning a photon sensitive substrate in a chamber, at operation 605. The photon sensitive substrate can be silicon with one or more dielectric layers, such as nitrides and oxides (which may be etched). The dielectric layer is formed by depositing a dielectric, such as silicon oxide or silicon nitride, on the substrate by a CVD process. This CVD process can be FCVD or PECVD.

The substrate is exposed to a first wavelength or first wavelength, at operation 610 by using for example, a Xenon (Xe) or mercury (Hg) lamp having wavelength from about 150 nm to about 800 nm. The wavelength can be filtered to a range of about 160 nm to about 250 nm, for example between about 170 nm to about 240 nm. Filtering may be accomplished by using a window (i.e., quartz) with dielectric coating. The coating may be alternating layers of materials having two different refractive indices. Alternately, a monochromatic light source, such as a laser may be used.

For example, an ArF excimer laser emits light at 193 nm. Thus the wavelength range may be a single wavelength. A narrow band lamp may also be used. For example, $Xe_2$* (wavelength distributed around 172 nm), KrCl* (wavelength distributed around 222 nm), KrF (wavelength distributed around 248 nm), XeBr (wavelength distributed around 282 nm), or XeCl (wavelength distributed around 308 nm) can generate UV radiation. In some embodiments, multiple lasers and/or lamps may be used.

At operation 615, the substrate is exposed to a second wavelength range or a second wavelength using a lamp or laser. The lamp or laser used for the second wavelength range or second wavelength may be different than the lamp or laser used for the first wavelength or wavelength range. The second wavelength or second wavelength range may include a wavelength lower than any wavelength in the first wavelength range. At operation 620, the substrate is exposed to a third wavelength range or a third wavelength using a lamp or laser. The lamp or laser used for the third wavelength range or third wavelength may be different than the lamp or laser used for the first or second wavelength or first or second wavelength range. The third wavelength or third wavelength range may include a wavelength lower than any wavelength in the first or second wavelength range. At operation 625, one or more of operations 605-620 of the sequenced UV treatment may be repeated one or more times until a desired endpoint is achieved.

The UV radiation source(s) may be, for example, UV lamp(s), UV laser(s), or a combination thereof. The UV radiation source(s) may be positioned outside of the processing chamber, and the processing chamber may have a quartz window through which UV radiation may pass. The dielectric coating is on the quartz window, and the coating may be on the side facing away from the processing region. The substrate may be positioned in a nonreactive gas environment, such as He, Ar, or vacuum, for example. The processing chamber may also include a microwave source to heat the substrate prior to or concurrently with exposing the substrate to UV radiation.

The power of the lamps may be between about 10 mW and about 200 mW, for example about 40 mW. The chamber can be under an atmosphere of $N_2$ or other non-reactive material at pressures ranging from sub-atmospheric to high vacuum. The temperature of the substrate is between about −100° C. and about 500° C., such as between about 0° C. and about 500° C., for example about room temperature. Typically, the duration for exposure to the mixture is controlled to be between about 25 seconds and about 180 seconds, for example between about 30 seconds and about 90 seconds. The substrate exposure to UV is maintained for a predetermined time period based on the substrate application or a conventional endpoint measurement technique that determines whether the Si—H, N—H, and/or Si—N bonds of the substrate have broken and whether the Si—Si bonds have been sufficiently formed.

In some embodiments, the first wavelength or wavelength range is between about 190 nm and about 800 nm, and can be centered to between about 190 nm and about 800 nm. The second wavelength or wavelength range is between about 180 nm and about 190 nm, and can be centered to between about 180 nm and about 190 nm. The third wavelength or wavelength range is between about 165 nm and about 180 nm (such as between about 170 nm and about 180 nm), and can be centered to between about 165 nm and about 180 nm (such as centered to between about 170 nm and about 180 nm).

Alternately, a monochromatic light source, such as a laser may be used. For example, the ArF excimer laser emits light at 193 nm. Thus the wavelength range may be a single wavelength. A narrow band lamp may also be used. For example, $Xe_2$* (wavelength distributed around 172 nm), KrCl* (wavelength distributed around 222 nm), KrF (wavelength distributed around 248 nm), XeBr (wavelength distributed around 282 nm), or XeCl (wavelength distributed around 308 nm) can generate UV radiation. In some embodiments, multiple lasers may be used. The UV irradiance power can be between about 100 $W/m^2$ and about 2000 $W/m^2$, for example about 1500 $W/m^2$.

In some embodiments the substrate is exposed to a lower energy UV light before exposure to a higher energy UV light. Such an approach can, for example, allow Si—Si bonds to rearrange and reform prior to cleavage of Si—H bonds. This approach can be useful, for example, for substrates comprising silicon atom chains that are not fully saturated with multiple hydrogen atoms.

In some embodiments, a substrate having silicon atom chains saturated with a high concentration of hydrogen atoms is exposed to a first wavelength range or wavelength and a second wavelength range or wavelength, wherein the first wavelength range or wavelength is of higher energy than the second wavelength range or wavelength. The substrate may then undergo a treatment process which can include for example, a healing operation. The healing operation may include, for example, a deposition operation, a reactive cure, a thermal cure, or a combination thereof. Exposure to UV and healing may then be repeated, independently, one or more times.

In some embodiments, a sequenced UV treatment operation and a healing operation may be performed. The healing operation may include a deposition operation, a reactive cure, a thermal cure, or a combination thereof.

Figure 7:
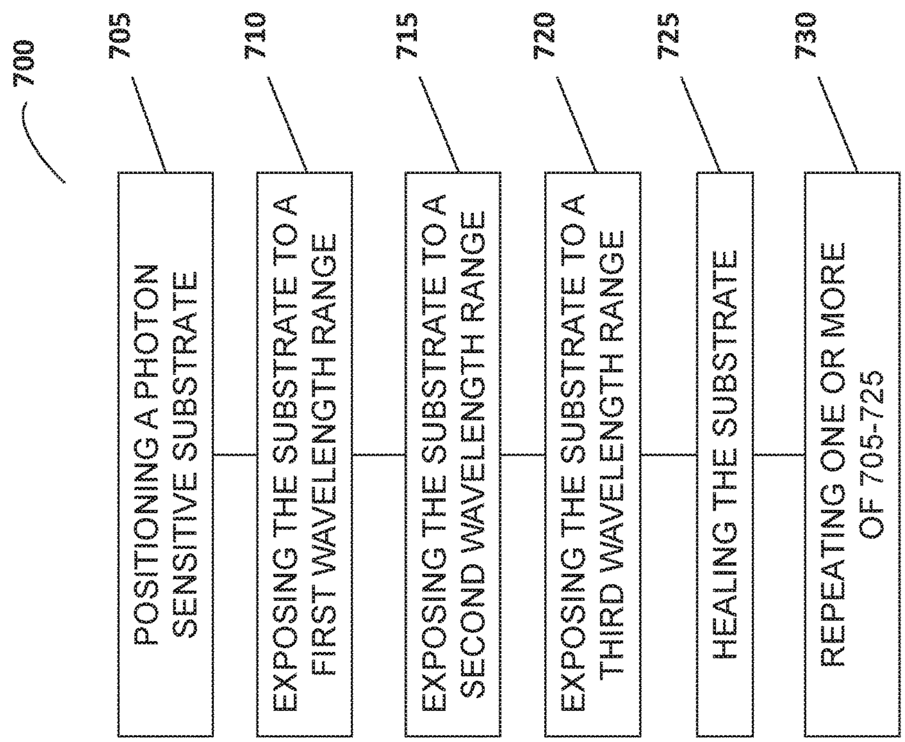
FIG. 7 is a process flow diagram for a method according to some embodiments.

FIG. 7 shows a process flow diagram for a method for a sequenced UV cure operation and a healing operation according to some embodiments. The method 700 includes positioning a photon sensitive substrate in a chamber, at operation 705. The photon sensitive substrate can be silicon with one or more nitrides and oxides (which may be etched) thereon. Layers on the substrate are formed by depositing a dielectric, such as silicon oxide or silicon nitride, on the substrate by a CVD process. This CVD process can be FCVD or PECVD. The substrate is exposed to a first wavelength range or wavelength, at operation 710 by using for example, a Xenon (Xe) or mercury (Hg) lamp having wavelength from about 150 m to about 800 nm. The wavelength can be filtered to a range of about 160 nm to about 250 nm, for example between about 170 nm to about 240 nm. Filtering may be accomplished by using a window (i.e., quartz) with dielectric coating. The coating may be alternating layers of materials having two different refractive indices. Alternately, a monochromatic light source, such as a laser may be used. For example, the ArF excimer laser emits light at 193 nm. Thus the wavelength range may be a single wavelength. A narrow band lamp may also be used. For example, $Xe_2$* (wavelength distributed around 172 nm), KrCl* (wavelength distributed around 222 nm), KrF (wavelength distributed around 248 nm), XeBr (wavelength distributed around 282 nm), or XeCl (wavelength distributed around 308 nm) can generate UV radiation. The UV irradiance power can be between about 100 $W/m^2$ and about 2000 $W/m^2$, for example 1500 $W/m^2$.

At operation 715, the substrate is exposed to a second wavelength range or wavelength using a lamp or laser. The lamp or laser used for the second wavelength range or wavelength may be different than the lamp or laser used for the first wavelength or wavelength range. The second wavelength range or wavelength may include a wavelength lower than any wavelength in the first wavelength range. At operation 720, the substrate is exposed to a third wavelength range or wavelength using a lamp or laser. The lamp or laser used for the third wavelength range or wavelength may be different than the lamp or laser used for the first or second wavelength or first or second wavelength range. The third wavelength or wavelength range may include a wavelength lower than any wavelength in the first or second wavelength range.

In some embodiments, the first wavelength or wavelength range is between about 190 nm and about 800 nm, and can be centered to between about 190 nm and about 800 nm. The second wavelength or wavelength range is between about 180 nm and about 190 nm, and can be centered to between about 180 nm and about 190 nm. The third wavelength or wavelength range is between about 165 nm and about 180 nm (such as between about 170 nm and about 180 nm), and can be centered to between about 165 nm and about 180 nm (such as centered to between about 170 nm and about 180 nm). Parameters for the exposure and healing may be any parameters described herein.

The substrate may undergo a healing operation 725. The healing operation may include, for example, a deposition operation, a reactive cure, a thermal cure, or a combination thereof. The sequenced UV cure and the healing process may be conducted in the same chamber. The UV cure process described above advantageously repairs the damaged pores in the sidewalls of features formed on or in the substrate. Healing operations can help to settle the amorphous Si or amorphous SiNx matrix so as to decrease degradation at higher temperatures and to mitigate shrinkage as the matrix collapses on itself during the sequence. At operation 730, one or more of operations 705-725 of the sequenced UV treatment and healing operation may be repeated one or more times, independently, until a desired endpoint is achieved.

In some embodiments, the healing operation 725 is a reactive cure. The reactive cure may be performed at the conclusion of a sequence of UV treatments, or during a sequence of UV treatments. The reactive cure may include exposing the silicon matrix to a reactive species containing silicon such that the silicon can move into the amorphous silicon matrix and forming extended Si—Si bonds as the hydrogen is evolving and thereby mitigating shrinkage as the matrix collapses on itself. Alternately, for SiNx material systems, the reactive cure may include exposing the silicon matrix to a reactive species containing nitrogen (for example, $NH_3$ or $N_2$) after plasma and/or thermal activation. As described herein, the substrate may then undergo a sequenced UV treatment and reactive cure, independently, one or more times.

The reactive species containing silicon may include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—Si—$(OCH_3)_3$), dimethyldimethoxysilane (DMDMS) ($(CH_3)_2$—Si—$(OCH_3)_2$), methyltrimethoxysilane (MTMS) ($(CH_3)_3$—Si—$OCH_3$), phenyltrimethoxysilane (PTMOS) ($C_6H_5$—Si—$(OCH_3)_3$), phenyldimethylchlorosilane (PDMCS) ($C_6H_5$—Si—$(CH_3)_2$—Cl), dimethylaminotrimethylsilane (DMATMS) ($(CH_3)_2$—N—$Si(CH_3)_3$), bis(dimethylamino)dimethylsilane (BDMADMS), octamethylcyclotetrasiloxane (OMCTS), methyldiethoxysilane (MDEOS), bis(tertiarybutylamino) silane (BTBAS), tridimethylaminosilane (TriDMAS), silane, disilane, dichlorosilane, trichlorosilane, dibromosilane, silicon tetrachloride, silicon tetrabromide, or combinations thereof.

The reactive cure may be conducted by placing the substrate into a processing chamber, vaporizing a silylation compound, and flowing the vaporized silylation compound into the processing chamber. The silylation compound may alternatively be vaporized in the processing chamber. The silylation compound may be introduced into the processing chamber through a showerhead positioned at an upper portion of the processing chamber. A carrier gas, such as He, may be used to assist the flow of the silylation compound into the processing chamber. The vapor phase silylation process may be conducted at a processing chamber pressure between about 1 Torr and about 500 Torr, such as about 6 Torr, a substrate temperature between about −100° C. and about 400° C., such as between about 20° C. and about 400° C., such as about 385° C., a silicon species flow rate between about 0.5 g/min and about 5 g/min, such as about 1 g/min, and a processing time between about 1 min and about 10 min, such as about 3 min. The pressure within the processing chamber may be varied during the vapor phase silylation process. For example, the pressure may be varied between about 1 Torr and 500 Torr. The silicon-containing precursor may be flowed into the chamber for a period of time sufficient to deposit a layer having a thickness of between about 5 A and about 2000 A. For example, the silicon-containing precursor may be flowed into the chamber for between about 0.1 seconds and about 120 seconds.

Alternately, for SiNx material systems, the reactive cure may include exposing a silicon matrix to a plasma of reactive species containing nitrogen (for example, $NH_3$ or $N_2$). The plasma may be formed by coupling RF power to a gas of the reactive species containing nitrogen. The processing chamber pressure may be between about 1 Torr and about 100 Torr, such as about 6 Torr, a substrate temperature between about −100° C. and about 400° C., such as between about 20° C. and about 400° C., such as about 385° C., a reactive species containing nitrogen gas flow rate between about 2 slm and about 20 slm, such as about 12 slm, a RF power between about 50 W and 1000 W, such as about 500 W, a RF power frequency of about 13.56 MHz, a processing time between about 10 seconds and about 180 seconds, such as about 60 seconds.

In some embodiments, the healing operation 725 is a deposition operation. The deposition operation may be performed at the conclusion of a sequence of UV treatments, or during a sequence of UV treatments. The deposition operation includes deposition of amorphous silicon by CVD, for example, FCVD. Since diffusion of silicon may be limited to the region near the surface, an operation comprising a limited amount of amorphous silicon (aSi) deposition may be performed. A sequenced UV treatment on the substrate may then be performed. The aSi deposition operation and sequenced UV treatment operation may be performed, independently, one or more times.

In some embodiments, the treatment operation 720 is a thermal cure or anneal operation. The thermal cure or anneal operation may be performed at the conclusion of a sequence of UV treatments, or during a sequence of UV treatments. A thermal cure or anneal operation can help settle the aSi matrix or SiNx matrix such that it does not degrade significantly at higher temperatures encountered in process integration. The thermal cure or anneal operation and sequenced UV treatment may be performed, independently, one or more times. The thermal cure or anneal operation may be any convenient semiconductor annealing process, including rapid thermal processing (RTP), spike anneal, laser anneal, or thermal bake. Typically, the matrix material can be heated to a temperature near its melting point, which for aSi is about 1280° C. and for SiNx is about 1900° C.

The descriptions of the various embodiments of the present disclosure have been presented for purposes of illustration, but are not intended to be exhaustive or limited to the embodiments disclosed. While the foregoing is directed to embodiments of the present disclosure, other and further embodiments of the disclosure may be devised without departing from the basic scope thereof, and the scope thereof is determined by the claims that follow. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of processing a substrate, comprising:

depositing a silicon matrix on a substrate;

exposing the silicon matrix to a first wavelength or wavelength range of ultraviolet radiation in an ultraviolet processing chamber;

exposing the silicon matrix to a second wavelength or wavelength range of ultraviolet radiation in the ultraviolet processing chamber, wherein the second wavelength or wavelength range includes a wavelength lower than any wavelength in the first wavelength or wavelength range;

exposing the silicon matrix to a third wavelength or wavelength range of ultraviolet radiation in the ultraviolet processing chamber, wherein the third wavelength or wavelength range includes a wavelength lower than any wavelength in the first wavelength or wavelength range and second wavelength or wavelength range; and repeating exposing the silicon matrix in the ultraviolet processing chamber to the first wavelength or wavelength range, the second wavelength or wavelength range, the third wavelength or wavelength range, or a combination thereof.

2. The method of claim 1, wherein the first wavelength or wavelength range is centered between about 190 nm and about 800 nm, the second wavelength or wavelength range is centered between about 180 nm and about 190 nm, and the third wavelength or wavelength range is centered between about 165 nm and about 180 nm.

3. The method of claim 1, further comprising maintaining a temperature of a substrate between about 0° C. and about 500° C. during exposure to ultraviolet radiation.

4. The method of claim 1, further comprising treating the silicon matrix by a deposition operation, a reactive cure, a thermal cure, or a combination thereof.

5. The method of claim 4, wherein the treating the silicon matrix is the reactive cure, the reactive cure comprising forming a plasma from a silicon-containing precursor to deposit a silicon-containing compound onto the substrate.

6. The method of claim 5, wherein the silicon-containing precursor is selected from the group consisting of octamethylcyclotetrasiloxane (OMCTS), methyldiethoxysilane (MDEOS), bis(tertiarybutylamino) silane (BTBAS), tridimethylaminosilane (TriDMAS), silane, disilane, dichlorosilane, trichlorosilane, dibromosilane, silicon tetrachloride, silicon tetra bromide, and a combination thereof.

7. The method of claim 4, wherein the treating the silicon matrix is the reactive cure, the reactive cure comprising forming a plasma from a nitrogen-containing precursor to deposit a nitrogen-containing compound onto the substrate, the nitrogen-containing precursor comprising $N_2$, $NH_3$, or a combination thereof.

8. The method of claim 4, wherein the treating the silicon matrix is the thermal cure, the thermal cure comprising exposing the substrate to a temperature of about −100° C. to about 500° C.

9. The method of claim 4, wherein the treating the silicon matrix is the thermal cure, the thermal cure comprising heating the silicon matrix at a melting point of the silicon matrix.

10. The method of claim 4, wherein the treating the silicon matrix is the deposition operation, the deposition operation comprising depositing an amorphous silicon film on a dielectric layer of the substrate.

11. The method of claim 1, wherein a filter, reflector, or combination thereof is used to define the first wavelength range, second wavelength range, and third wavelength range.

12. A method of processing a substrate, comprising:

depositing a silicon matrix on a substrate;

exposing the silicon matrix to a first wavelength or wavelength range of ultraviolet radiation in an ultraviolet processing chamber;

exposing the silicon matrix to a second wavelength or wavelength range of ultraviolet radiation in the ultraviolet processing chamber, wherein the second wavelength or wavelength range includes a wavelength lower than any wavelength in the first wavelength or wavelength range;

exposing the silicon matrix to a third wavelength or wavelength range of ultraviolet radiation in the ultraviolet processing chamber, wherein the third wavelength range includes a wavelength lower than any wavelength in the first wavelength or wavelength range and second wavelength or wavelength range;

treating the silicon matrix by a deposition operation, a reactive cure, a thermal cure, or a combination thereof; and repeating exposing the silicon matrix in the ultraviolet processing chamber to the first wavelength or wavelength range, the second wavelength or wavelength range, the third wavelength or wavelength range, or a combination thereof.

13. The method of claim 12, wherein the first wavelength or wavelength range is centered between about 190 nm and about 800 nm, the second wavelength or wavelength range is centered between about 180 nm and about 190 nm, and the third wavelength or wavelength range is centered between about 165 nm and about 180 nm.

14. The method of claim 12, further comprising maintaining a temperature of the substrate between about −100° C. and about 500° C. during exposure to ultraviolet radiation.

15. The method of claim 12, wherein the treating the silicon matrix is the reactive cure, the reactive cure comprising forming a plasma from a silicon-containing precursor to deposit a silicon-containing material onto the substrate.

16. The method of claim 15, wherein the silicon-containing precursor is selected from the group consisting of octamethylcyclotetrasiloxane (OMCTS), methyldiethoxysilane (MDEOS), bis(tertiarybutylamino) silane (BTBAS), tridimethylaminosilane (TriDMAS), silane, disilane, dichlorosilane, trichlorosilane, dibromosilane, silicon tetrachloride, silicon tetra bromide, and a combination thereof.

17. The method of claim 12, wherein the treating the silicon matrix is the reactive cure, the reactive cure comprising exposing the silicon matrix to a plasma formed from a nitrogen-containing precursor to deposit a nitrogen-containing compound onto the substrate, the nitrogen-containing precursor comprising $N_2$, $NH_3$, or a combination thereof.

18. The method of claim 12, wherein a filter, reflector, or combination thereof is used to define the first, second, and third wavelength or wavelength ranges.

19. A method of processing a substrate, comprising:

depositing a silicon matrix on a substrate;

exposing the silicon matrix to a first ultraviolet radiation having a wavelength or wavelength range between about 190 nm and about 800 nm in the ultraviolet processing chamber;

exposing the silicon matrix to a second ultraviolet radiation having a wavelength or wavelength range between about 180 nm and about 190 nm in the ultraviolet processing chamber;

exposing the silicon matrix to a third ultraviolet radiation having a wavelength or wavelength range between about 165 nm and about 180 nm in an ultraviolet processing chamber;

treating the silicon matrix by a deposition operation, a reactive cure, a thermal cure, or a combination thereof;

repeating exposing the silicon matrix to the first, second, and third ultraviolet radiation in the ultraviolet processing chamber; and maintaining a temperature of the substrate between about −100° C. and about 500° C. during exposure to ultraviolet radiation.

20. The method of claim 19, wherein the treating the silicon matrix is the reactive cure, the reactive cure comprising exposing the silicon matrix to a plasma formed from the group consisting of $N_2$, $NH_3$, octamethylcyclotetrasiloxane (OMCTS), methyldiethoxysilane (MDEOS), bis(tertiarybutylamino) silane (BTBAS), tridimethylaminosilane (TriDMAS), silane, disilane, dichlorosilane, trichlorosilane, dibromosilane, silicon tetrachloride, silicon tetra bromide, and a combination thereof to deposit a material onto the substrate.

* * * * *